(12) United States Patent
Barth, Jr. et al.

(10) Patent No.: US 7,061,793 B2
(45) Date of Patent: Jun. 13, 2006

(54) APPARATUS AND METHOD FOR SMALL SIGNAL SENSING IN AN SRAM CELL UTILIZING PFET ACCESS DEVICES

(75) Inventors: John E. Barth, Jr., Williston, VT (US); George M. Braceras, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/708,713

(22) Filed: Mar. 19, 2004

(65) Prior Publication Data

US 2005/0207210 A1  Sep. 22, 2005

(51) Int. Cl.
G11C 7/12 (2006.01)
G11C 11/41 (2006.01)
G11C 11/419 (2006.01)
G11C 7/06 (2006.01)

(52) U.S. Cl. ............... 365/154; 365/189.06; 365/156; 365/207; 365/190; 365/189.11

(58) Field of Classification Search ................ 365/154, 365/156, 189.06, 207, 190, 189.11; 257/903; 327/57

See application file for complete search history.

(56) References Cited

U.S. PATENT DOCUMENTS

| 5,604,705 A * | 2/1997 | Ackland et al. ............ 365/205 |
| 6,341,083 B1 | 1/2002 | Wong .......................... 365/154 |
| 6,549,453 B1 | 4/2003 | Wong .......................... 365/156 |
| 2003/0002329 A1 | 1/2003 | Wong .......................... 365/156 |
| 2003/0147272 A1 | 8/2003 | Joshi et al. .................. 365/156 |

* cited by examiner

Primary Examiner—Richard Elms
Assistant Examiner—J. H. Hur
(74) Attorney, Agent, or Firm—Michael J. LeStrange; Cantor Colburn LLP

(57) ABSTRACT

A method for small signal sensing during a read operation of a static random access memory (SRAM) cell includes coupling a pair of complementary sense amplifier data lines to a corresponding pair of complementary bit lines associated with the SRAM cell, and setting a sense amplifier so as to amplify a signal developed on the sense amplifier data lines, wherein the bit line pair remains coupled to the sense amplifier data lines at the time the sense amplifier is set.

6 Claims, 4 Drawing Sheets

APPARATUS AND METHOD FOR SMALL SIGNAL SENSING IN AN SRAM CELL UTILIZING PFET ACCESS DEVICES

BACKGROUND OF INVENTION

The present invention relates generally to integrated circuit memory devices and, more particularly, to an apparatus and method for small signal sensing in static random access memory (SRAM) cells utilizing PFET access devices.

A typical static random access memory (SRAM) cell includes an array of individual SRAM cells. Each SRAM cell is capable of storing a binary voltage value therein, which voltage value represents a logical data bit (e.g., "0" or "1"). One existing configuration for an SRAM cell includes a pair of cross-coupled devices such as inverters. With CMOS (complementary metal oxide semiconductor) technology, the inverters further include a pull-up PFET (p-channel) transistor connected to a complementary pull-down NFET (n-channel) transistor. The inverters, connected in a cross-coupled configuration, act as a latch that stores the data bit therein so long as power is supplied to the memory array.

In a conventional six-transistor cell 100 such as shown in FIG. 1, a pair of access transistors or pass gates T1, T2 (when activated by a word line LWL) selectively couples the inverters to a pair of complementary bit lines BLT, BLC. Prior to a read operation, the bit lines BLT, BLC are precharged to the power supply voltage $V_{DD}$. A read operation commences when a restore circuit (not shown) is turned off, and the word line LWL is driven high so as to activate NFET pass gates T1, T2. This in turn electrically connects the internal nodes A, B of the cell 100 to bit lines BLT, BLC, respectively. Whichever of the two bit lines is connected to the "low" (logic 0) cell node will begin to discharge to ground at a rate proportional to the current drive of the cell (i.e., the series connection of either T2 and T4, or T1 and T3), and the capacitance of the bit lines. The bit line connected to the "high" (logic 1) cell node will be left floating high, since its respective word line access device is cut off (i.e., both the drain and source terminals thereof are at $V_{DD}$ potential). The voltage difference between the bit line discharging to ground and the bit line left floating high is referred to as the bit line signal. Because the bit lines are typically highly capacitive, and cell current is typically relatively low, it generally takes a significant amount of time to generate an adequate amount of signal to reliably sense and amplify the cell data.

Accordingly, it would be desirable to be able to accurately sense the data in an SRAM cell at smaller level of signal differential than a conventional cell, and thus at an earlier time in the read cycle.

SUMMARY OF INVENTION

The foregoing discussed drawbacks and deficiencies of the prior art are overcome or alleviated by a method for small signal sensing during a read operation for a static random access memory (SRAM) cell. In an exemplary embodiment, the method includes coupling a pair of complementary sense amplifier data lines to a corresponding pair of complementary bit lines associated with the SRAM cell, and setting a sense amplifier so as to amplify a signal developed on the sense amplifier data lines, wherein the bit line pair remains coupled to the sense amplifier data lines at the time the sense amplifier is set.

In another embodiment, a method for implementing a read operation for a static random access memory (SRAM) cell includes activating a word line associated with the SRAM cell, and deactivating a precharge circuit configured for precharging a pair of complementary bit lines associated with the SRAM cell. A corresponding pair of complementary sense amplifier data lines is coupled to the pair of complementary bit lines associated with the SRAM cell, and a sense amplifier is set so as to amplify a signal developed on the sense amplifier data lines. The bit line pair remains coupled to the sense amplifier data lines at the time the sense amplifier is set.

In still another embodiment, an apparatus for small signal sensing during a read operation of a static random access memory (SRAM) cell includes a pair of complementary sense amplifier data lines selectively coupled to a corresponding pair of complementary bit lines associated with the SRAM cell, and a sense amplifier configured to amplify a signal developed on the sense amplifier data lines. The bit line pair is coupled to the sense amplifier data lines whenever the sense amplifier is set.

BRIEF DESCRIPTION OF DRAWINGS

Referring to the exemplary drawings wherein like elements are numbered alike in the several Figures.

DETAILED DESCRIPTION

Disclosed herein is an apparatus and method for small signal sensing in SRAM cells, in which a bit switch pair couples a true and complement bit line pair to a corresponding pair of sense amp data lines both prior to and during activation of the sense amplifier. By configuring an SRAM cell with PFET access transistors, whichever of the bit lines (true or complement) that is coupled to the high node is clamped to $V_{DD}$ through the corresponding PFET access transistor of the SRAM cell that is coupled to the word line. As a result of this clamping assistance provided by the memory cell PFET, the sense amplifier will be able to properly amplify with a smaller degree of signal on the bit lines.

Figure 1:
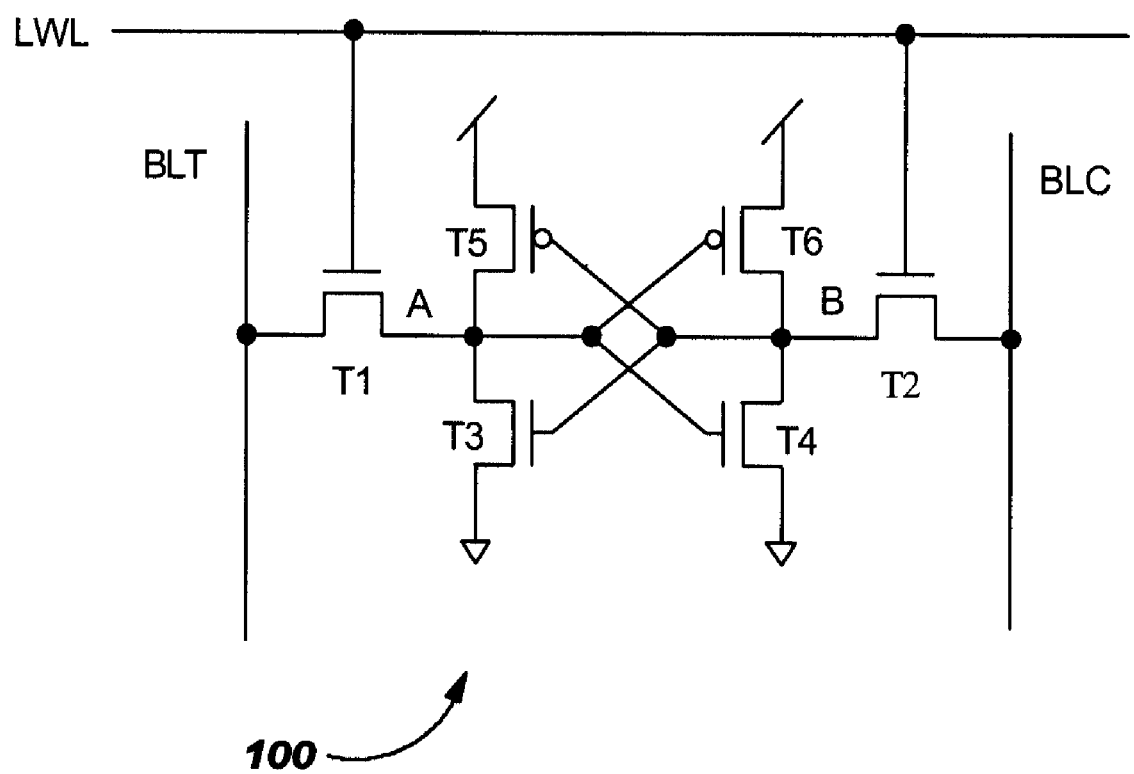
FIG. 1 is a schematic diagram of a conventional SRAM storage cell.
Figure 2:
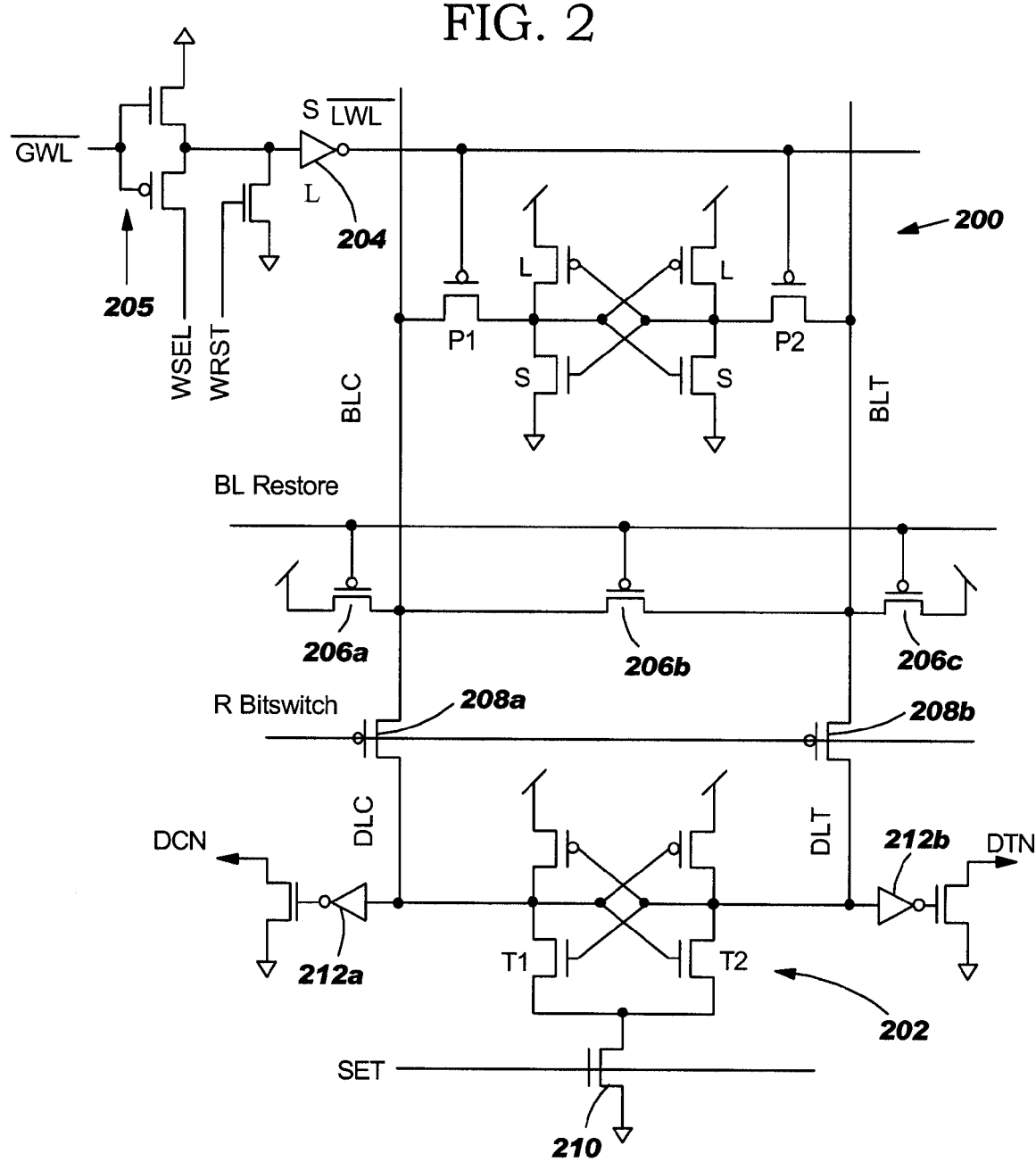
FIG. 2 is a schematic diagram of an SRAM storage cell and associated sense amplifier, configured in accordance with an embodiment of the invention.

Referring now to FIG. 2, there is shown a schematic diagram of an SRAM storage cell 200 and associated sense amplifier 202, configured in accordance with an embodiment of the invention. In contrast to the cell 100 shown in FIG. 1, cell 200 utilizes PFET devices P1, P2 as the access transistors thereto. Accordingly, the local word line LWL coupled to the gate terminals of P1 and P2 is active low. FIG. 2 also illustrates a portion of the global word line circuitry 205, the operation of which is well known to those skilled in the art.

The designations "S" and "L" associated with the cell transistors and the local word line inverter 204 refer to the relative strengths of the NFET and PFET devices. In a conventional CMOS inverter or SRAM cell, the relative strength of a PFET pull up device is weaker with respect to the NFET pull down device. Thus, the inverter 204 is labeled "S" (small) above the inverter symbol in FIG. 2 and "L" (large) below the inverter symbol, meaning the PFET device therein is small compared to the NFET device therein. In contrast, the SRAM cell 200 in FIG. 2 has large strength pull up PFETs compared to the cell NFETs, for purposes that will become apparent hereinafter.

The bit lines BLT, BLC of cell 200 are precharged to $V_{DD}$ prior to a read operation by precharge circuitry including a series of pull up devices 206a, 206b and 206c, controlled by an active low signal labeled "BL Restore". The precharge circuitry operates in conjunction with a pair of read bit switches 208a, 208b, controlled by an active low signal labeled "R Bitswitch". The read bit switches selectively couple the cell bit line pair BLT, BLC, to a corresponding sense amplifier data line pair DLT, DLC, during a read operation. More specifically, during a read operation, the precharge circuitry is deactivated as the local wordline LWL is activated so as to couple the SRAM cell nodes to the bit line pair BLT, BLC. As this occurs, the bit line initially coupled to the logic high at the beginning of the read operation will begin to discharge to ground through one of the corresponding SRAM cell NFETs while the other bit line (left floating at high in a conventional cell) is actually clamped to $V_{DD}$ due to the PFET access device (P1 or P2). Therefore, a voltage differential is now developed across the bit line pair.

In addition, the signal developed on the bit line pair BLT, BLC, is also transferred to the sense amplifier data line pair, since the read bit switches are also activated at the beginning of the read operation. When a sufficiently large signal (i.e., voltage differential) is developed on the sense amplifier data line pair DLT, DLC, the sense amplifier 202 is set (i.e., activated) from an initial floating state by coupling the NFET devices T1, T2 therein to ground through a pull down device activated by a set signal (SET). Once activated, the sense amplifier 202 amplifies the developed signal on DLT, DLC, to the full $V_{DD}$ swing value. Because the sense amplifier 202 actually latches a data value opposite that stored in the SRAM cell 200, a pair of inverters 212a, 212b is used to drive the correct data onto the data true and complement nodes DTN, DCN.

Ignoring momentarily the fact that the present embodiment of FIG. 2 utilizes PFET access devices, in a conventional SRAM cell having NFET devices, the activation of the control signals BL Restore, R Bitswitch and SET are precisely coordinated with one another with regard to timing and interlocking. This is done so that the sense amplifier 202 is not set too early before there is adequate time to develop a sufficiently strong signal differential on DLT, DLC. If the sense amplifier 202 were to be activated too early, and if there were a voltage threshold mismatch in the sense amplifier pull down devices, then it is possible that the sense amplifier 202 could latch incorrect data therein.

In contrast, the use of PFET access devices in the present invention allows the clamping of precharged bit line associated with the low cell node to $V_{DD}$ through the corresponding PFET access transistor P1, P2. Moreover, unlike a conventional read operation, the bit switch pair 208a, 208b, remains active during the setting of the sense amplifier 202, thereby effectively clamping one of the data lines to $V_{DD}$ through one of the "large" PFET pull up devices in the cell 200. However, this would not be the case for an SRAM cell having NFET access devices, since they would not provide a clamp to $V_{DD}$ when activated. Moreover, a coupling of the bit line pair to the data line pair during the sense amplifier set in a conventional scheme would also provide unwanted capacitive loading on the sense amplifier, further adding to the signal development time. Thus, it will be appreciated that with the configuration of FIG. 2, any problems with voltage threshold mismatch in the sense amplifier 202 will be easier to overcome. Therefore, the SET signal can be activated at an earlier point in time when the signal differential on DLT, DLC is smaller than conventionally required.

Figure 3:
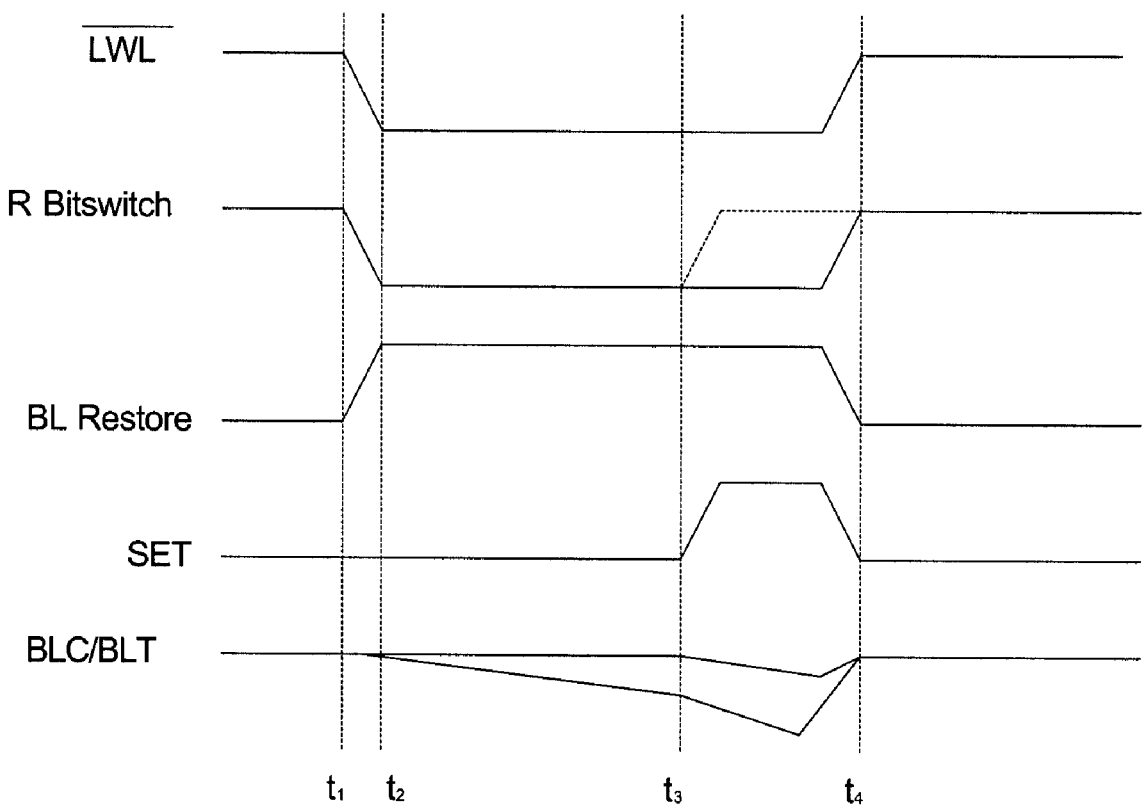
FIG. 3 is a timing diagram illustrating a method for small signal sensing in SRAM cells employing PFET pass gates, in accordance with a further embodiment of the invention.

FIG. 3 is a timing diagram illustrating a read operation using the cell configuration of FIG. 2. As is shown, the read operation begins at time $t_1$, at which point the local word line LWL is rendered active by transitioning from high to low. Concurrently, the R Bitswitch signal transitions from high to low in order to couple the sense amplifier data lines to the bit lines, while the bit line precharge circuitry is deactivated by signal BL Restore transitioning from low to high. Shortly thereafter, the voltage on one of the precharged bit lines BLT, BLC begins to drop (as shown at $t_2$) while the other bit line remains clamped to $V_{DD}$. Upon development of a sufficient signal at time $t_3$, the sense amplifier is activated, reflected by the SET signal transitioning from low to high in FIG. 3.

For purposes of illustration, the dashed transition in the R Bitswitch signal indicates the operation of a conventional cell, in which the sense amp data lines would be uncoupled from the bit lines when the sense amplifier is set, as discussed above. However, in the present embodiment, R Bitswitch remains active through the setting of the sense amplifier to maintain the clamping function. Thus, when the amplifier latches the cell data at time $t_4$, the correct data is read from the cell and the SET signal can be triggered with a smaller amount of signal present on the bit lines.

Figure 4:
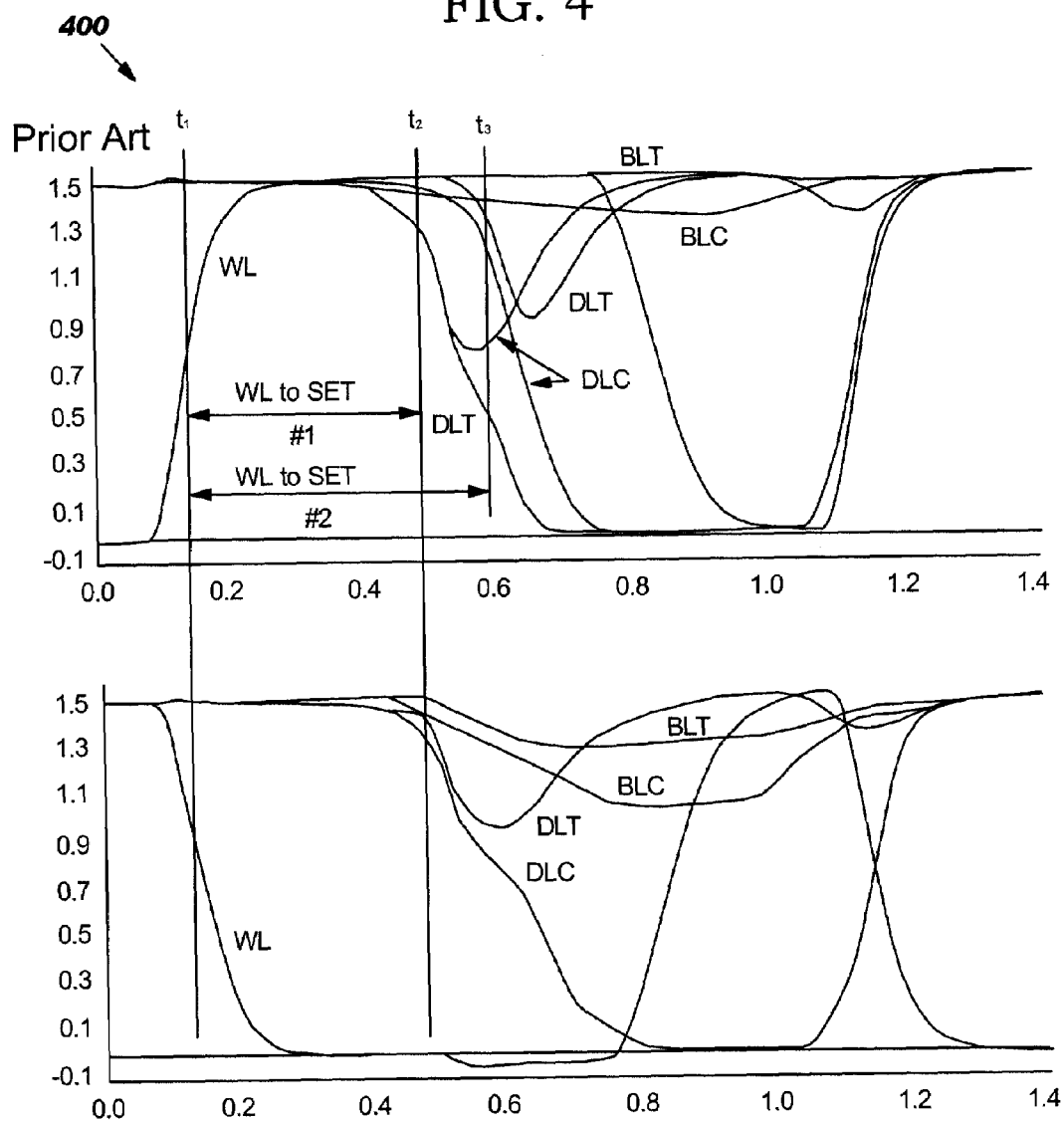
FIG. 4 is a graph comparing simulated results between a conventional SRAM read operation and the present method.

Finally, FIG. 4 is a graph 400 comparing simulated results between a conventional SRAM read operation and a read operation in accordance with the apparatus and method shown in FIGS. 2 and 3. The upper portion of the graph demonstrates both a successful data read operation and an unsuccessful data read operation for a conventional SRAM cell coupled to a sense amplifier having a +30 mV voltage threshold mismatch on one pull down transistor and a −30 mV voltage threshold mismatch on the other pull down transistor. With the conventional cell with NFET access transistors, the read operation commences at $t_1$ with the word line signal (WL) transitioning from low to high. In the simulation of FIG. 4, it is assumed that the SRAM cell node coupled to the true bit line has a logic 1 stored therein.

Time $t_2$ in FIG. 4 represents an "early" set of the sense amplifier; in other words, the amount of time indicated by "WL to SET #1" is considered to be too early for an appropriate amount of signal to be developed on the bit line pair (i.e., a relatively small voltage differential between BLT and BLC). As a result of both a voltage threshold mismatch in the sense amplifier and an early set signal at time $t_2$, the sense amplifier has incorrectly latched the true data line DLT to low and the complementary data line DLC to high. As such, time $t_3$ (WL to SET #2) may be considered a sufficiently long time for a signal to be developed on BLT and BLC. Thus, if the set signal is activated at $t_3$ for the conventional SRAM cell, the sense amplifier will properly latch DLT to high and DLT to low.

In contrast, the lower portion of FIG. 4 illustrates that the sense amplifier will properly latch DLT and DLC to the correct logic levels, even if the set signal is activated at the earlier time $t_2$. Although the signal developed on the bit line pair is smaller at $t_2$ than at $t_3$, the clamping function provided by the PFET access transistor combined with keeping the sense amplifier data line pair coupled to the bit line pair prevents the sense amplifier from latching an incorrect cell state. Thus configured, the read operation timings are less susceptible to voltage threshold mismatches in the sense amplifier, and can allow for shorter read times.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for small signal sensing during a read operation of a static random access memory (SRAM) cell, the method comprising:
    coupling a pair of complementary sense amplifier data lines to a corresponding pair of complementary bit lines associated with the SRAM cell;
    setting a sense amplifier so as to amplify a signal developed on said sense amplifier data lines,
    wherein said bit line pair remains coupled to said sense amplifier data lines at the time said sense amplifier is set; and
    configuring the SRAM cell with PFET access transistors so as to clamp one of said pair of complementary sense amplifier data lines to a logic high voltage upon activation of a word line associated with the SRAM cell;
    wherein said clamping is implemented through one of a pair of pull up transistors within the SRAM cell, and
    wherein said pair of pull up transistors within the SRAM cell has larger a pull up strength relative to a pull down strength of a pair of pull down transistors within the SRAM cell.

2. The method of claim 1, wherein said pair of complementary sense amplifier data lines is coupled to said corresponding pair of complementary bit lines through a pair of activated bit switches.

3. A method for implementing a read operation for a static random access memory (SRAM) cell, the method comprising:
    activating a word line associated with the SRAM cell;
    deactivating a precharge circuit configured for precharging a pair of complementary bit lines associated with the SRAM cell;
    coupling a corresponding pair of complementary sense amplifier data lines to said pair of complementary bit lines associated with the SRAM cell;
    setting a sense amplifier so as to amplify a signal developed on said sense amplifier data lines,
    wherein said bit line pair remains coupled to said sense amplifier data lines at the time said sense amplifier is set; and
    configuring the SRAM cell with PFET access transistors so as to clamp one of said pair of complementary sense amplifier data lines to a logic high voltage upon activation of a word line associated with the SRAM cell;
    wherein said clamping is implemented through one of a pair of pull up transistors within the SRAM cell, and
    wherein said pair of pull up transistors within the SRAM cell has larger a pull up strength relative to a pull down strength of a pair of pull down transistors within the SRAM cell.

4. The method of claim 3, wherein said pair of complementary sense amplifier data lines is coupled to said corresponding pair of complementary bit lines through a pair of activated bit switches.

5. An apparatus for small signal sensing during a read operation of a static random access memory (SRAM) cell, comprising:
    a pair of complementary sense amplifier data lines selectively coupled to a corresponding pair of complementary bit lines associated with the SRAM cell;
    a sense amplifier configured to amplify a signal developed on said sense amplifier data lines,
    wherein said bit line pair is coupled to said sense amplifier data lines wherein said sense amplifier is set; and
    a pair of PFET access transistors associated with the SRAM cell, said PFET access transistors configured to clamp one of said pair of complementary sense amplifier data lines to a logic high voltage upon activation of a word line associated with the SRAM cell;
    said clamp further implemented through one of a pair of pull up transistors within the SRAM cell; and
    wherein said pair of pull up transistors within the SRAM cell has larger a pull up strength relative to a pull down strength of a pair of pull down transistors within the SRAM cell.

6. The apparatus of claim 1, wherein said pair of complementary sense amplifier data lines is coupled to said corresponding pair of complementary bit lines through a pair of activated bit switches.

* * * * *